(12) United States Patent
Li et al.

(10) Patent No.: US 7,586,342 B2
(45) Date of Patent: *Sep. 8, 2009

(54) PROGRAMMABLE AMPLITUDE COMPENSATION CIRCUIT

(75) Inventors: Qiang Li, Irvine, CA (US); Razieh Roufoogaran, Venice, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/072,437

(22) Filed: Feb. 26, 2008

(65) Prior Publication Data

US 2008/0157829 A1 Jul. 3, 2008

Related U.S. Application Data

(63) Continuation of application No. 11/580,601, filed on Oct. 12, 2006, now Pat. No. 7,358,779.

(51) Int. Cl.
*H03B 1/00* (2006.01)
(52) U.S. Cl. .......................... 327/108; 327/63; 327/69; 327/77; 327/90
(58) Field of Classification Search ........................ None
See application file for complete search history.

(56) References Cited

U.S. PATENT DOCUMENTS

| 5,336,940 A | * | 8/1994 | Sorrells et al. .............. 327/276 |
| 6,995,554 B2 | * | 2/2006 | Loke et al. ................ 324/76.54 |
| 2004/0062121 A1 | * | 4/2004 | Chung et al. ................ 365/222 |

* cited by examiner

*Primary Examiner*—An T Luu
(74) *Attorney, Agent, or Firm*—Farjami & Farjami LLP

(57) ABSTRACT

According to one exemplary embodiment, an amplitude compensation circuit includes a first composite programmable buffer for receiving a first input signal with a first input amplitude. The amplitude compensation circuit further includes a second composite programmable buffer for receiving a second input signal with a second input amplitude. The amplitude compensation circuit also includes a feedback circuit coupled to respective outputs of the first and second composite programmable buffers. According to this embodiment, the feedback circuit compares a first output amplitude of the first composite programmable buffer with a reference voltage and a second output amplitude of the second composite programmable buffer with the reference voltage and provides first and second control signals for adjusting the respective gains of the first and second composite programmable buffers so as to reduce respective differences between the first and second output amplitudes and the reference voltage.

17 Claims, 4 Drawing Sheets

PROGRAMMABLE AMPLITUDE COMPENSATION CIRCUIT

This is a continuation of application Ser. No. 11/580,601 filed Oct. 12, 2006, now became U.S. Pat. No. 7,358,779.

BACKGROUND OF THE INVENTION

1. Field of the Invention

The present invention is generally in the field of electrical circuits. More particularly, the invention is in the field of electrical circuits used in communication devices.

2. Background Art

In-phase (I) and quadrature (Q) signals are typically utilized in modulation and demodulation sections of transceivers in cellular handsets and other types of communication devices. The I and Q signals, which are 90 degrees out of phase, can be generated, for example, by coupling an input local oscillator signal to first and second outputs via different RC networks. For example, one RC network can include a capacitor coupled between the input and the first output and a resistor coupled between the first output and ground and the other RC network can include a capacitor coupled between the input and the second output and a resistor coupled between the second output and ground. To achieve balanced I and Q signals (i.e. I and Q signals having the same amplitude), the resistors in each RC network and the capacitors in each RC network must have the same and predetermined value according to the operation frequency. However, process variations, particularly in the resistors, can cause the I and Q signals to significantly differ in amplitude, thereby undesirably affecting transceiver performance.

In one approach, system level calibration can be used to reduce the difference in amplitude between the I and Q signals. However, system level calibration is not effective if the difference in amplitude of the I and Q signals is too great. In another approach, calibrated resistors can be used in the RC networks to achieve I and Q signals having similar amplitudes. However, at high local oscillator frequencies, such as 5.0 GHz, each RC network requires a very small value resistor, which is difficult to calibrate.

SUMMARY OF THE INVENTION

An amplitude compensation circuit with programmable buffers substantially as shown in and/or described in connection with at least one of the figures, as set forth more completely in the claims.

DETAILED DESCRIPTION OF THE INVENTION

The present invention is directed to an amplitude compensation circuit with programmable buffers. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1:
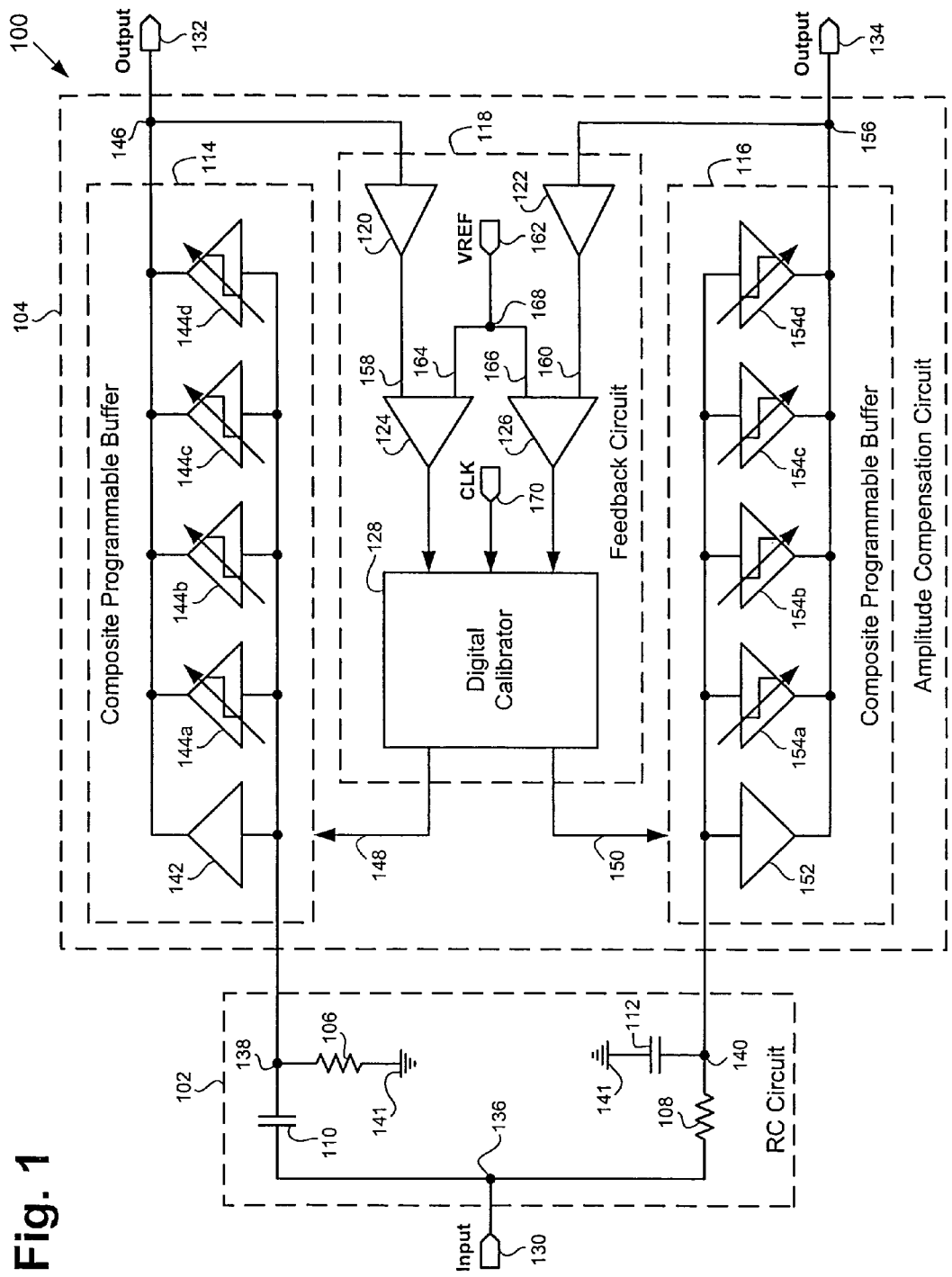
FIG. 1 illustrates a block diagram of an exemplary system including an exemplary amplitude compensation circuit in accordance with one embodiment of the present invention.

FIG. 1 shows a block diagram of an exemplary system including an RC circuit coupled to an amplitude compensation circuit in accordance with one embodiment of the present invention. Certain details and features have been left out of FIG. 1, which are apparent to a person of ordinary skill in the art. Exemplary system 100 includes RC circuit 102 and amplitude compensation circuit 104, which is also referred to as an "I/Q amplitude compensation circuit" in the patent application. RC circuit 102 includes resistors 106 and 108 and capacitors 110 and 112 and amplitude compensation circuit 104 includes composite programmable buffers 114 and 116 and feedback circuit 118. Feedback circuit 118 includes amplitude detectors 120 and 122, comparators 124 and 126, and digital calibrator 128. System 100 can be utilized in a communication device, such as a cellular handset or other type of wireless or wireline communication device, and can be fabricated on a single semiconductor die.

As shown in FIG. 1, input 130 is coupled to first terminals of capacitor 110 and resistor 108 at node 136 (i.e. the input of RC circuit 102) and the second terminals of capacitor 110 and resistor 108 are coupled to respective nodes 138 and 140. Input 130 can provide a sinusoidal signal, such as an RF sinusoidal signal. In one embodiment, input 130 can provide a local oscillator signal. Also shown in FIG. 1, resistor 106 and capacitor 112 are coupled between respective nodes 138 and 140 and ground 141. In RC circuit 102, resistors 106 and 108 can be selected to have substantially the same and predetermined value, and capacitors 110 and 112 can also be selected to have substantially the same and predetermined value, according to the operation frequency (Frequency=1/(2π RC)). The output signals provided by RC circuit 102 at nodes 138 and 140 are inputted into amplitude compensation circuit 104 and respective composite programmable buffers 114 and 116 at nodes 138 and 140.

As a result of the RC network formed by capacitor 110 and resistor 106 and the RC network formed by resistor 108 and capacitor 112, the signals outputted by RC circuit 102 at nodes 138 and 140 have the same frequency but are out of phase with each other. In one embodiment, the signals outputted by RC circuit at nodes 138 and 140 can be respective I (in-phase) and Q (quadrature) signals, where the Q signal is 90 degrees out of phase with the I signal. Ideally, the output signals at nodes 138 and 140 have the same amplitude, i.e. they are balanced signals. However, fabrication process variations can cause the values of resistors 106 and 108 and, to a lesser extent, the values of capacitors 110 and 112 to change. For example, process variations can cause resistors 106 and 108 to vary by 20.0 percent or more.

Process variations typically cause resistors 106 and 108 to vary in the same direction, i.e. resistors 106 and 108 both either increase or decrease in value. However, when resistors 106 and 108 both increase or both decrease in value, they have opposite effects on the amplitudes of the output signals at respective nodes 138 and 140. As a result of the changes in values of resistors 106 and 108 and capacitors 110 and 112 caused by process variations, the amplitudes of the output signals at nodes 138 and 140 can be significantly different. In one embodiment, the output signals at nodes 138 and 140 can be respective I and Q signals having different amplitudes.

Further shown in FIG. 1, constant transconductance (Gm) buffer 142 and programmable buffers 144a, 144b, 144c, and 144d (hereinafter "programmable buffers 144a through 144d") in composite programmable buffer 114 are coupled in a parallel configuration between node 138 (i.e. the input of composite programmable buffer 114) and node 146 (i.e. the output of composite programmable buffer 114). Node 138 also forms an output of RC circuit 102 and an input of amplitude compensation circuit 104 and node 146 also forms an output of amplitude compensation circuit 104 and provides composite programmable buffer output 132 (hereinafter "output 132"). Programmable buffer 144a has a transconductance that is hereinafter referred to as "$Gm_1$," which can be selected to provide a desired incremental change of transconductance in composite programmable buffer 114. For example, $Gm_1$ might have a value of 3.0 milisiemens (mS). In the present embodiment, programmable buffer 144b has a transconductance (hereinafter referred to as "$Gm_2$") that can be equal to $2.0 \bullet Gm_1$, programmable buffer 144c has a transconductance (hereinafter referred to as "$Gm_3$") that can be equal to $4.0 \bullet Gm_1$, and programmable buffer 144d has a transconductance (hereinafter referred to as "$Gm_4$") that can be equal to $8.0 \bullet Gm_1$.

Programmable buffers 144a through 144d can each be independently programmed by control signal 148 to be either ON or OFF. In the present embodiment, control signal 148, which is outputted by digital calibrator 128 in feedback circuit 118, can be a 4-bit control signal, where each bit of control signal 148 can control one of the programmable buffers (i.e. programmable buffers 144a through 144d). Thus, control signal 148 can cause any combination of the programmable buffers to be either ON or OFF. In other embodiments, control signal 148 may comprise more or less than four bits. Constant Gm buffer 142 is always turned ON (i.e. it is not programmable) and has a transconductance (hereinafter referred to as "$Gm_{constant}$") that determines the minimum transconductance of composite programmable buffer 114. Thus, for example, if programmable buffers 144a through 144d are turned OFF via control signal 148, the transconductance of composite programmable buffer 114 will be equal to $Gm_{constant}$. Thus, $Gm_{constant}$ can be selected to ensure that composite programmable buffer 114 provides an output signal having at least a minimum required amplitude at its output (i.e. the output of composite programmable buffer 114 at node 146).

Also shown in FIG. 1, constant Gm buffer 152 and programmable buffers 154a, 154b, 154c, and 154d (hereinafter "programmable buffers 154a through 154d") in composite programmable buffer 116 are coupled in a parallel configuration between node 140 (i.e. the input of composite programmable buffer 116) and node 156 (i.e. the output of composite programmable buffer 116). Node 140 also forms an output of RC circuit 102 and an input of amplitude compensation circuit 104 and node 156 also forms an output of amplitude compensation circuit 104 and provides composite programmable buffer output 134 (hereinafter "output 134"). Constant Gm buffer 152 and programmable buffers 154a through 154d have substantially the same transconductance as constant Gm buffer 142 and programmable buffers 144a through 144d, respectively. Thus, constant Gm buffer 152 and programmable buffers 154a, 154b, 154c, and 154d have respective transconductances $Gm_{constant}$, $Gm_1$, $Gm_2$, $Gm_3$, and $Gm_4$. Thus, $Gm_{constant}$ (i.e. the transconductance of constant Gm buffer 152) also determines the minimum transconductance of composite programmable buffer 116.

Programmable buffers 154a through 154d can each be independently programmed by control signal 150 to be either ON or OFF. In the present embodiment, control signal 150, which is outputted by digital calibrator 128 in feedback circuit 118, can be a 4-bit control signal, where each bit of control signal 150 can control one of the programmable buffers (i.e. programmable buffers 154a through 154d). In other embodiments, control signal 150 may be have more or less than four bits. Thus, the programmable buffers in composite programmable buffers 114 and 116 are similarly controlled by respective control signals 148 and 150.

Further shown in FIG. 1, the inputs of detectors 120 and 122 are coupled to respective nodes 146 and 156 and the outputs of detectors 120 and 122 are coupled to respective inputs 158 and 160 of comparators 124 and 126. Detector 120 can be configured to detect the amplitude of the signal at node 146 (i.e. output 132) and output the detected amplitude of output 132 and detector 122 can be configured to detect the amplitude of the signal at node 156 (i.e. output 134) and the detect amplitude of output 134. Also shown in FIG. 1, reference voltage (VREF) 162 is coupled to inputs 164 and 166 of respective comparators 124 and 126 at node 168 and the outputs of comparators 124 and 126 are coupled to respective inputs of digital calibrator 128. Comparator 124 can be configured to provide an output corresponding to the difference between the detected amplitude of output 132 and VREF 162 and comparator 126 can be configured to provide an output corresponding to the difference between the detected amplitude of output 134 and VREF 162.

Further shown in FIG. 1, clock (CLK) 170 is coupled to an input of digital calibrator 128 and control signals 148 and 150 are outputted by digital calibrator 128 and coupled to respective composite programmable buffers 114 and 116. Digital calibrator 128 can be configured to appropriately adjust the value of control signal 148 in response to the difference between the detected amplitude of output 132 and VREF 162 and to appropriately adjust the value of control signal 150 in response to the difference between the detected amplitude of output 134 and VREF 162. Digital calibrator 128 can also be configured to store previous values of control signals 148 and 150.

The operation of amplitude compensation circuit 104 will now be discussed. Amplitude compensation circuit 104 receives input signals having the same frequency from RC circuit 102 at respective nodes 138 and 140, where the input signal at node 140 can be out of phase with the input signal at node 138, and where input signals at nodes 138 and 140 can have different amplitudes. In one embodiment, an I (in-phase) signal can be received at node 138 and a 90.0 degree phase-shifted Q (quadrature) signal can be received at node 140, where the I and Q signals can have different amplitudes. The input signals at nodes 138 and 140 are amplified by composite programmable buffers 114 and 116, which provide outputs 132 and 134, respectively. The amplitudes of outputs 132 and 134 are detected by feedback circuit 118 and compared to VREF 162.

Feedback circuit 118 then determines the required digital values of control signals 148 and 150 to appropriately adjust the gains of respective composite programmable buffers 114 and 116 so as to substantially reduce the differences between the amplitudes of outputs 132 and 134 and VREF 162 and, thereby, substantially reduce the difference in the amplitudes of outputs 132 and 134. Thus, VREF 162 can be selected to determine the final amplitude of outputs 132 and 134. The process of adjusting the respective gains of composite programmable buffers 114 and 116 in response to comparisons between the detected amplitudes of respective outputs 132 and 134 and VREF 162 as discussed above can be continued through an appropriate number of iterations so as to cause a desired reduction in the difference between the amplitudes of outputs 132 and 134. For example, the process for adjusting the gains of composite programmable buffers 114 and 116 in response to the detected amplitudes of respective outputs 132 and 134 discussed above can be continued through four iterations. However, more or less than four iterations can be utilized to achieve a corresponding reduction in the respective differences between the amplitudes of outputs 132 and 134 and VREF 162 and, thereby, a corresponding reduction in the difference between the amplitudes of outputs 132 and 134.

After each iteration, the previous values of control signals 148 and 150 can be stored in digital calibrator 128 and new values can be determined for control signals 148 and 150. The new values of control signals 148 and 150 can then be utilized to further adjust the gains of respective composite programmable buffers 114 and 116 so as to cause a further reduction in the difference between the amplitudes of outputs 132 and 134. In one embodiment, the difference between the amplitudes of outputs 132 and 134 can be sufficiently reduced so as to cause the amplitudes of outputs 132 and 134 to be substantially equal.

Thus, by utilizing composite programmable buffers and a feedback circuit, the embodiment of the invention in FIG. 1 provides an amplitude compensation circuit that can receive two phase-shifted input signals having different amplitudes and provide corresponding respective output signals having a substantially reduced difference in amplitude. In one embodiment, the two phase-shifted input signals can be an I (in-phase) signal and a 90.0 degree phase-shifted Q (quadrature) signal. The embodiment of the invention in FIG. 1 also achieves an amplitude compensation circuit that can be advantageously fabricated on a single semiconductor die.

Figure 2:
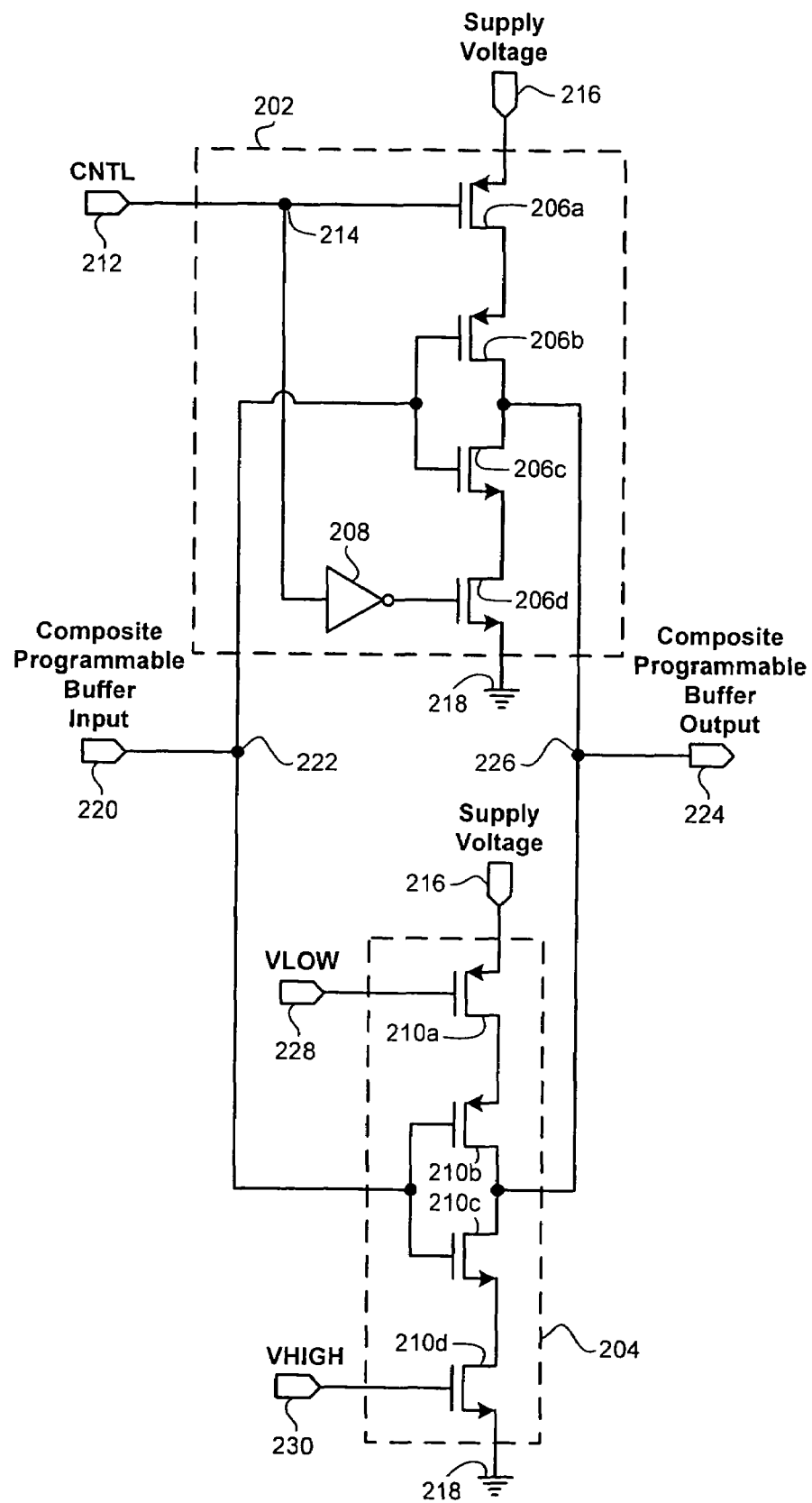
FIG. 2 illustrates a circuit diagram of an exemplary programmable buffer coupled to an exemplary constant Gm buffer in accordance with one embodiment of the present invention.

FIG. 2 shows a circuit diagram of an exemplary programmable buffer coupled to an exemplary constant Gm buffer in accordance with one embodiment of the present invention. In FIG. 2, programmable buffer 202 corresponds to programmable buffers 144a and 154a in FIG. 1 and constant Gm buffer 204 corresponds to constant Gm buffers 142 and 152 in FIG. 1. Programmable buffer 202 includes transistors 206a, 206b, 206c, and 206d (hereinafter "transistors 206a through 206d"), and inverter 208 and constant Gm buffer 204 includes transistors 210a, 210b, 210c, and 210d (hereinafter "transistors 210a through 210d").

As shown in FIG. 2, control signal (CNTL) 212 is coupled to the gate of transistor 206a and the input of inverter 208 at node 214, the source of transistor 206a is coupled to supply voltage 216, which can be VDD, and the drain of transistor 206a is coupled to the source of transistor 206b. CNTL 212 can be a digital signal that can correspond to a portion of control signal 148 or control signal 150 in FIG. 1. For example, CNTL 212 can correspond to one bit of control signal 148 or control signal 150. Also shown in FIG. 2, the gates of transistors 206b and 206c, which form the input of programmable buffer 202, are coupled to the gates of transistors 210b and 210c, which form the input of constant Gm buffer 204, and composite programmable buffer input 220 at node 222. Further shown in FIG. 2, the drains of transistors 206b and 206c, which form the output of programmable buffer 202, are coupled to the drains of transistors 210b and 210c, which form the output of constant Gm buffer 204, and composite programmable buffer output 224 at node 226. In programmable buffer 202, transistors 206a and 206b can be PMOS transistors and transistors 206c and 206d can be NMOS transistors, for example. In another embodiment, programmable buffer 202 may be implemented with different types of transistors.

Also shown in FIG. 2, the gate of transistor 210a is coupled to low voltage input (VLOW) 228, the source of transistor 210a is coupled to supply voltage 216, and the drain of transistor 210a is coupled to the source of transistor 210b. VLOW 228 provides a sufficiently low voltage so as to cause transistor 210a to turn ON. Further shown in FIG. 2, the gate of transistor 210d is coupled to high voltage input (VHIGH) 230, the source of transistor 210d is coupled to ground 218, and the drain of transistor 210d is coupled to the source of transistor 210c. VHIGH 230 provides a sufficiently high voltage so as to cause transistor 210d to turn ON. In constant Gm buffer 204, transistors 210a and 210b can be PMOS transistors and transistors 210c and 210d can be NMOS transistors, for example. In another embodiment, constant Gm buffer 204 may be implemented using different types of transistors.

The operation of programmable buffer 202 and constant Gm buffer 204 will now be discussed. When CNTL 212 is low, CNTL 212 causes programmable buffer 202 to turn ON by causing transistor 206a (e.g. a PMOS transistor) to turn ON and transistor 206d (e.g. an NMOS transistor) to turn ON via inverter 208. Constant Gm buffer 204 is also turned ON, since VLOW 228 and VHIGH 230 turn ON respective transistors 210a (e.g. a PMOS transistor) and 210d (e.g. an NMOS transistor). Thus, since the input and output of programmable buffer 202 are coupled to the respective input and output of constant Gm buffer 204, the total transconductance provided by programmable buffer 202 and constant Gm buffer 204 is equal to the sum of $Gm_1$ (i.e. the transconductance of programmable buffer 202) and $Gm_{constant}$ (i.e. the transconductance of constant Gm buffer 204). Thus, when CNTL 212 is low, combination of programmable buffer 202 and constant Gm buffer 204 provides a gain at composite programmable buffer output 224 that is determined by $Gm_1 + Gm_{constant}$.

When CNTL 212 is high, CNTL 212 causes programmable buffer 202 to turn OFF by causing transistor 206a to turn OFF and transistor 206d to turn OFF via inverter 208. Constant Gm buffer 204, which is not controlled by CNTL 212, remains turned ON via VLOW 228 and VHIGH 230. Thus, when CNTL 212 is high, the total transconductance provided by programmable buffer 202 and constant Gm buffer 204 is equal to $Gm_{constant}$. Thus, when CNTL 212 is high, combination of programmable buffer 202 and constant Gm buffer 204 provides a gain at composite programmable buffer output 224 that is determined by $Gm_{constant}$ (i.e. the transconductance of constant Gm buffer 204).

Figure 3:
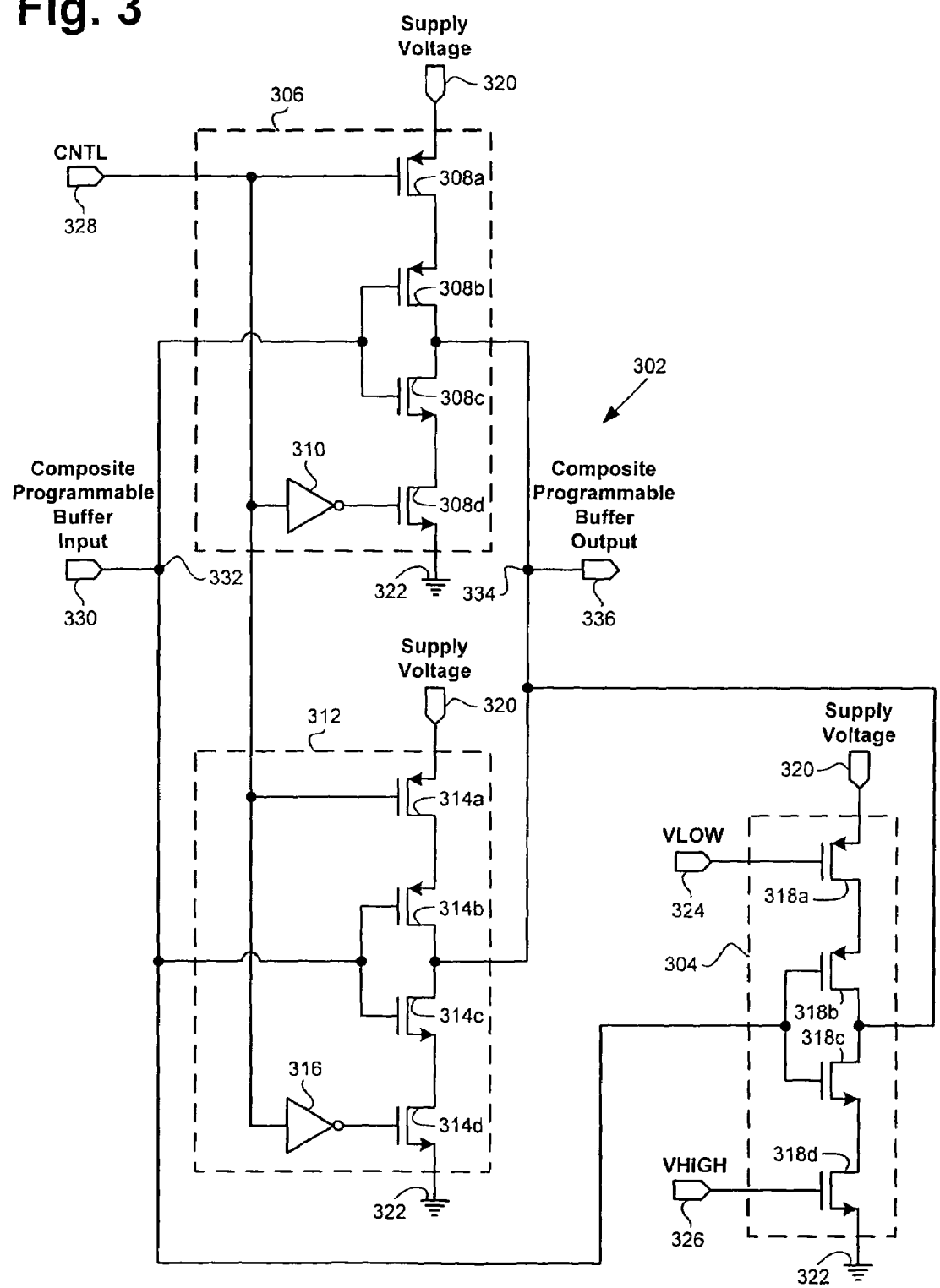
FIG. 3 illustrates a circuit diagram of an exemplary programmable buffer coupled to an exemplary constant Gm buffer in accordance with one embodiment of the present invention.

FIG. 3 shows a circuit diagram of an exemplary programmable buffer coupled to an exemplary constant Gm buffer in accordance with one embodiment of the present invention. In FIG. 3, programmable buffer 302 corresponds to programmable buffers 144b and 154b in FIG. 1 and constant Gm buffer 304 corresponds to constant Gm buffers 142 and 152 in FIG. 1 and constant Gm buffer 204 in FIG. 2. Programmable buffer 302 includes section 306, which includes transistors 308a, 308b, 308c, and 308d (hereinafter "transistors 308a through 308d"), and inverter 310, and section 312, which includes transistors 314a, 314b, 314c, and 314d (hereinafter "transistors 314a through 314d"), and inverter 316.

In FIG. 3, transistors 308a through 308d, and inverter 310 and transistors 314a through 314d, and inverter 316 correspond, respectively, to transistors 206a through 206d, and inverter 208 in FIG. 2. Constant Gm buffer 304 includes transistors 318a, 318b, 318c, and 318d (hereinafter "transistors 318a through 318d"), which correspond, respectively, to transistors 210a through 210d. Also in FIG. 3, supply voltage 320, ground 322, low voltage input (VLOW) 324, and high voltage input (VHIGH) 326 correspond, respectively, to supply voltage 216, ground 218, VLOW 228, and VHIGH 226 in FIG. 2.

As shown in FIG. 3, control signal (CNTL) 328 can be a digital signal that can correspond to a portion of control signal 148 or control signal 150 in FIG. 1. For example, CNTL 328 can correspond to one bit of control signal 148 or control signal 150. The inputs of sections 306 and 312 of programmable buffer 302 and the input of constant Gm buffer 304 are coupled to composite programmable buffer input 330 at node 332 and the outputs of sections 306 and 312 of programmable buffer 302 and the output of constant Gm buffer 304 are coupled to node 334, which provides composite programmable buffer output 336.

The operation of programmable buffer 302 and constant Gm buffer 304 will now be discussed. When CNTL 328 is low, sections 306 and 312 of programmable buffer 302 are turned ON and coupled in parallel with constant Gm buffer 304, which is turned ON via VLOW 324 and VHIGH 326. Thus, when CNTL 328 is low, the parallel-coupled combination of programmable buffer 302 and constant Gm buffer 304 provides a gain at composite programmable buffer output 336 that is determined by sum of $Gm_2$ (i.e. the transconductance of programmable buffer 302) and $Gm_{constant}$ (i.e. the transconductance of constant Gm buffer 304).

When CNTL 328 is high, sections 306 and 312 of programmable buffer 302 are turned OFF while constant Gm buffer 304 is turned ON via VLOW 324 and VHIGH 326. Thus, when CNTL 328 is high, the parallel-coupled combination of programmable buffer 302 and constant Gm buffer 304 provides a gain at composite programmable buffer output 336 that is determined by $Gm_{constant}$ (i.e. the transconductance of constant Gm buffer 304).

Figure 4:
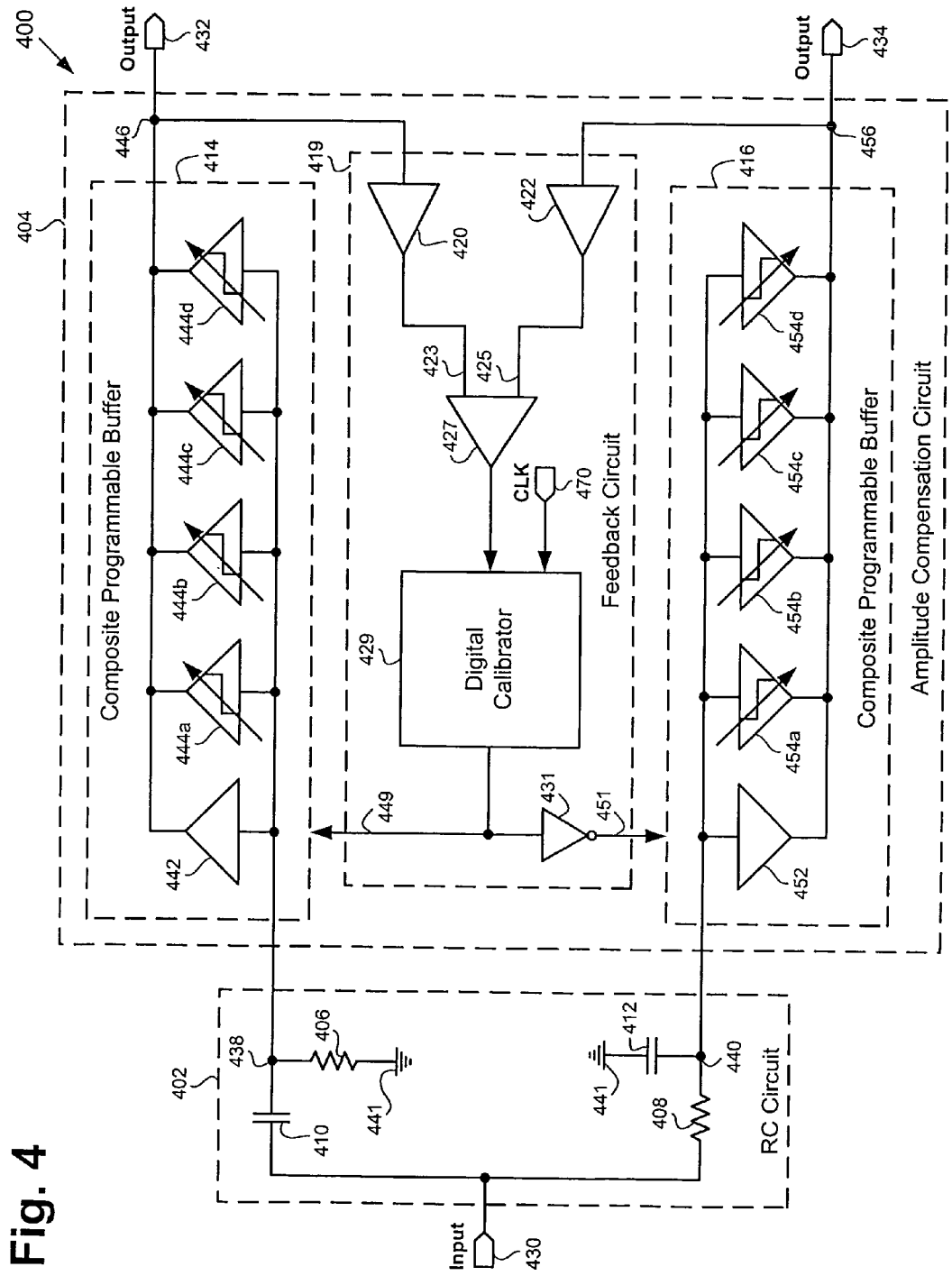
FIG. 4 illustrates a block diagram of an exemplary system including an exemplary amplitude compensation circuit in accordance with one embodiment of the present invention.

FIG. 4 shows a block diagram of an exemplary system including an exemplary RC circuit coupled to an exemplary amplitude compensation circuit in accordance with one embodiment of the present invention. Certain details and features have been left out of FIG. 4, which are apparent to a person of ordinary skill in the art. System 400 includes RC circuit 402 and amplitude compensation circuit 404, which includes composite programmable buffers 414 and 416 and feedback circuit 419. In FIG. 4, RC circuit 402 and composite programmable buffers 414 and 416 correspond, respectively, to RC circuit 102 and composite programmable buffers 114 and 116 in system 100 in FIG. 1. In particular, resistors 406 and 408, capacitors 410 and 412, input 430, outputs 432 and 434, ground 441, constant Gm buffers 442 and 452, and programmable buffers 444a through 444d and 454a through 454d correspond, respectively, to resistors 106 and 108, capacitors 110 and 112, input 130, outputs 132 and 134, ground 141, constant Gm buffers 142 and 152, and programmable buffers 144a through 144d and 154a through 154d in FIG. 1. Similar to system 100 in FIG. 1, system 400 can be utilized in a communication device, such as a cellular handset or other type of wireless communication device, and can be fabricated on a single semiconductor die.

In system 400, feedback circuit 419 includes detectors 420 and 422, comparator 427, digital calibrator 429, and inverter 431. As shown in FIG. 4, the inputs of detectors 420 and 422 are coupled to respective nodes 446 (i.e. the output of composite programmable buffer 414) and 456 (i.e. the output of composite programmable buffer 416) and the outputs of detects 420 and 422 are coupled to respective inputs 423 and 425 of comparator 427. Detectors 420 and 422 correspond, respectively, to detectors 120 and 122 in feedback circuit 118 in FIG. 1. Also shown in FIG. 4, the output of comparator 427 and clock 470 are coupled to respective inputs of digital calibrator 429. Clock 470 corresponds to clock 170 in feedback circuit 118 in FIG. 1. Comparator 427 can be configured to provide an output corresponding to the difference between the detected amplitude of output 432 at input 423 and the detected amplitude of output 434 at input 425.

Further shown in FIG. 4, control signal 449, which is a digital signal, is outputted by digital calibrator 429 and coupled to composite programmable buffer 414 and inverter 431, which provides control signal 451 to composite programmable buffer 416. Digital calibrator 429 can be configured to appropriately adjust the value of control signal 449 in response to the difference between the detected amplitudes of outputs 432 and 434.

Amplitude compensation circuit 404 operates in a similar manner as amplitude compensation circuit 104 in FIG. 1 discussed above so as to cause the amplitude of output 432 to be substantially equal to the amplitude of output 434 by substantially reducing the difference between the amplitudes of outputs 432 and 434. In particular, the amplitudes of outputs 432 and 434 are detected and compared in feedback circuit 419. Feedback circuit 419 then determines the digital values of control signals 449 and 451 to appropriately adjust the gains of respective composite programmable buffers 414 and 416 to cause the amplitude of output 432 to be substantially equal to the amplitude of output 434. Since control signal 451 is the inverted form of control signal 449, when control signal 449 causes the gain of composite programmable buffer 414 to increase, control signal 451 causes the gain of composite programmable buffer 416 to decrease, and vice versa.

The process of adjusting the gains of composite programmable buffers 414 and 416 in response to the difference between the sensed amplitudes of outputs 432 and 434 can continue through an appropriate number of iterations as required to achieve a desired reduction in the amplitude different between outputs 432 and 434. After each iteration, the difference between the amplitudes of outputs 432 and 434 is determined and new values for control signals 449 and 451 are provided to respective composite programmable buffers 414 and 416 to further reduce the difference in amplitude between outputs 432 and 434. Similar to the process discussed above in relation to the embodiment in FIG. 1, the number of iterations can be selected so as to cause a desired reduction in the difference between the amplitudes of outputs 432 and 434. The amplitude compensation circuit in the embodiment of the invention in FIG. 4 provides similar advantages as discussed above for the amplitude compensation circuit in the embodiment of the invention in FIG. 1.

Thus, as discussed above, in the embodiments in FIGS. 1 and 4, by utilizing composite programmable buffers and a feedback circuit, the invention provides an amplitude compensation circuit that can receive two phase-shifted input signals having different amplitudes and provide corresponding respective output signals having a substantially reduced difference in amplitude. In one embodiment, the two phase-shifted input signals can be an I (in-phase) signal and a 90.0 degree phase-shifted Q (quadrature) signal. In the embodiments in FIGS. 1 and 4, the invention also provides an amplitude compensation circuit that can be advantageously fabricated on a single semiconductor die.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, an amplitude compensation circuit with programmable buffers has been described.

The invention claimed is:

1. An amplitude compensation circuit comprising:
   a composite programmable buffer for receiving an input signal with an input amplitude;
   a feedback circuit driven by an output of said composite programmable buffer;
   said feedback circuit comparing an output amplitude of an output of said composite programmable buffer with a reference amplitude;
   said feedback circuit producing a control signal for adjusting a gain of said composite programmable buffer so as to vary said output amplitude relative to said input amplitude.

2. The amplitude compensation circuit of claim 1, wherein said control signal adjusts said gain by changing a conductance of said composite programmable buffer.

3. The amplitude compensation circuit of claim 1, wherein said composite programmable buffer comprises a plurality of programmable buffers, wherein each of said plurality of programmable buffers is controlled by said control signal.

4. The amplitude compensation circuit of claim 3, wherein said composite programmable buffer further comprises a constant conductance buffer coupled in parallel with each of said plurality of programmable buffers.

5. The amplitude compensation circuit of claim 3, wherein said control signal causes each of said plurality of programmable buffers to be either ON or OFF so as to adjust said gain of said composite programmable buffer.

6. A composite programmable buffer comprising:
   at least one programmable buffer;
   a feedback circuit comparing an output amplitude of an output of said composite programmable buffer with a reference amplitude;
   said feedback circuit producing a control signal for causing said at least one programmable buffer to be either ON or OFF so as to vary said output amplitude.

7. The composite programmable buffer of claim 6, wherein said control signal varies a gain of said composite programmable buffer.

8. The composite programmable buffer of claim 6, wherein said at least one programmable buffer is coupled in parallel to a constant conductance buffer.

9. An amplitude compensation circuit comprising:
   a composite programmable buffer for receiving an input signal with an input amplitude, said composite programmable buffer comprising at least one programmable buffer;
   a feedback circuit comparing an output amplitude of an output of said composite programmable buffer with a reference amplitude;
   said feedback circuit producing a control signal for causing said at least one programmable buffer to be either ON or OFF so as to vary said output amplitude.

10. The amplitude compensation circuit of claim 9, wherein a conductance of said composite programmable buffer is varied when said control signal causes said at least one programmable buffer to be either ON or OFF.

11. The amplitude compensation circuit of claim 9, wherein said composite programmable buffer further comprises a constant conductance buffer coupled in parallel with said at least one programmable buffer.

12. An amplitude compensation circuit comprising:
    a composite programmable buffer for receiving an input signal with an input amplitude;
    a feedback circuit driven by an output of said composite programmable buffer;
    said feedback circuit comparing an output amplitude of an output of said composite programmable buffer with a reference amplitude;
    said feedback circuit causing said output amplitude to vary relative to said input amplitude.

13. The amplitude compensation circuit of claim 12, wherein said feedback circuit produces a control signal to adjust a gain of said composite programmable buffer.

14. The amplitude compensation circuit of claim 13, wherein said control signal causes a change in a conductance of said composite programmable buffer.

15. The amplitude compensation circuit of claim 12, wherein said composite programmable buffer comprises a plurality of programmable buffers.

16. The amplitude compensation circuit of claim 15, wherein said composite programmable buffer further comprises a constant conductance buffer coupled in parallel with each of said plurality of programmable buffers.

17. The amplitude compensation circuit of claim 12, wherein a control signal causes each of said plurality of programmable buffers to be either ON or OFF so as to adjust a gain of said composite programmable buffer.

* * * * *